(12) United States Patent
Layh et al.

(10) Patent No.: US 9,304,400 B2
(45) Date of Patent: Apr. 5, 2016

(54) ILLUMINATION SYSTEM FOR EUV MICROLITHOGRAPHY

(75) Inventors: Michael Layh, Aalen (DE); Ralf Stuetzle, Aalen (DE); Damian Fiolka, Oberkochen (DE); Martin Endres, Koenigsbronn (DE); Holger Weigand, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1091 days.

(21) Appl. No.: 13/038,453

(22) Filed: Mar. 2, 2011

(65) Prior Publication Data

US 2011/0177463 A1 Jul. 21, 2011

Related U.S. Application Data

(63) Continuation of application No. PCT/EP2009/004973, filed on Jul. 9, 2009.

(60) Provisional application No. 61/101,193, filed on Sep. 30, 2008.

(30) Foreign Application Priority Data

Sep. 30, 2008 (DE) .................. 10 2008 042 462

(51) Int. Cl.
*G03B 27/54* (2006.01)
*G03F 7/20* (2006.01)
(Continued)

(52) U.S. Cl.
CPC ........ *G03F 7/70083* (2013.01); *G02B 17/0605* (2013.01); *G02B 17/0647* (2013.01); *G02B 27/0043* (2013.01); *G03F 7/70033* (2013.01); *G03F 7/70075* (2013.01)

(58) Field of Classification Search
CPC ............ G03F 7/70075; G03F 7/70033; G03F 7/70083; G03F 7/70175
USPC ......................................... 355/67, 53; 378/34
See application file for complete search history.

(56) References Cited

U.S. PATENT DOCUMENTS 6,400,794 B1 6/2002 Schultz et al.
6,704,095 B2 3/2004 Schultz
(Continued)

FOREIGN PATENT DOCUMENTS

DE 199 03 807 A1 11/1999
DE 100 53 587 A1 5/2002
(Continued)

OTHER PUBLICATIONS

Japanese office action, with English translation thereof, for corresponding JP Appl No. 2011-528 196, dated Apr. 3, 2013.
(Continued)

*Primary Examiner* — Peter B Kim
(74) *Attorney, Agent, or Firm* — Fish & Richardson P.C.

(57) ABSTRACT

An illumination system for EUV microlithography includes an EUV light source which generates EUV illumination light with an etendue that is higher than 0.01 mm$^2$. The EUV light source generates a sequence of EUV light pulses having a pulse sequence frequency. An illumination optics of the illumination system is used to guide the illumination light from the light source to an object field. At least one optical modulation component of the illumination system is preferably modulatable synchronously with the pulse sequence frequency. The result is an illumination system where a homogeneity of an object field illumination is improved.

34 Claims, 9 Drawing Sheets

(51) Int. Cl.
*G02B 17/06* (2006.01)
*G02B 27/00* (2006.01)

(56) References Cited

U.S. PATENT DOCUMENTS

| | | | |
|---|---|---|---|
| 6,840,640 B2 | 1/2005 | Antoni et al. | |
| 6,977,718 B1 * | 12/2005 | LaFontaine | 355/67 |
| 7,583,433 B2 | 9/2009 | Antoni et al. | |
| 2002/0009178 A1 | 1/2002 | Dinger et al. | |
| 2002/0136351 A1 | 9/2002 | Singer | |
| 2002/0141071 A1 | 10/2002 | Singer et al. | |
| 2003/0002022 A1 | 1/2003 | Schultz | |
| 2003/0076607 A1 | 4/2003 | Antoni et al. | |
| 2003/0081193 A1 * | 5/2003 | White et al. | 355/72 |
| 2004/0130809 A1 * | 7/2004 | Antoni et al. | 359/846 |
| 2005/0083503 A1 | 4/2005 | Antoni et al. | |
| 2005/0185165 A1 | 8/2005 | Watanabe | |
| 2006/0132747 A1 | 6/2006 | Singer et al. | |
| 2007/0058244 A1 | 3/2007 | Singer | |
| 2009/0041182 A1 | 2/2009 | Endres et al. | |
| 2009/0316128 A1 | 12/2009 | Mann et al. | |
| 2011/0014799 A1 | 1/2011 | Dinger et al. | |

FOREIGN PATENT DOCUMENTS

| | | |
|---|---|---|
| DE | 10 2006 020 734 A1 | 11/2007 |
| EP | 1 026 547 A | 8/2000 |
| EP | 1 120 670 A2 | 8/2001 |
| EP | 1 319 988 A | 6/2003 |
| EP | 1 319 988 A2 | 6/2003 |
| EP | 1 793 277 A | 6/2007 |
| JP | 2000-003858 | 1/2000 |
| JP | 2002-198309 | 7/2002 |
| JP | 2003-185798 | 7/2003 |
| JP | 2005-235999 | 9/2005 |
| JP | 2005-294087 | 10/2005 |
| JP | 2006-019510 | 1/2006 |
| KR | 2003-0051206 | 6/2003 |
| WO | WO 01/09684 | 2/2001 |
| WO | WO 2007/128407 | 11/2007 |
| WO | WO 2009/066242 | 5/2009 |
| WO | WO 2009/074211 | 6/2009 |
| WO | WO 2009/121438 | 10/2009 |

OTHER PUBLICATIONS

International Search Report and a Written Opinion from the counterpart PCT Application No. PCT/EP2009/004973, mailed Dec. 29, 2009.
German Examination Report, with English translation, for corresponding Application DE 10 2008 042 462.5-51, dated Apr. 15, 2009.
Antoni et al., "Illumination Optics Design for EUV—Lithogrpahy," Proc. of SPIE, vol. 4146, S.25-S.34 (2000).
Japanese Office Action, with translation thereof, for JP Appl No. 2011-528196, dated Feb. 13, 2014.
Japanese office action, with English translation thereof, for JP application No. 2011-528 196, dated Nov. 6, 2014.
Korean office action, with English translation, for KR Appl No. 10-2011-7009713, dated Sep. 17, 2015.
Japanese office action, with English translation, for corresponding JP App No. 2015-047226, dated Nov. 24, 2015.

* cited by examiner

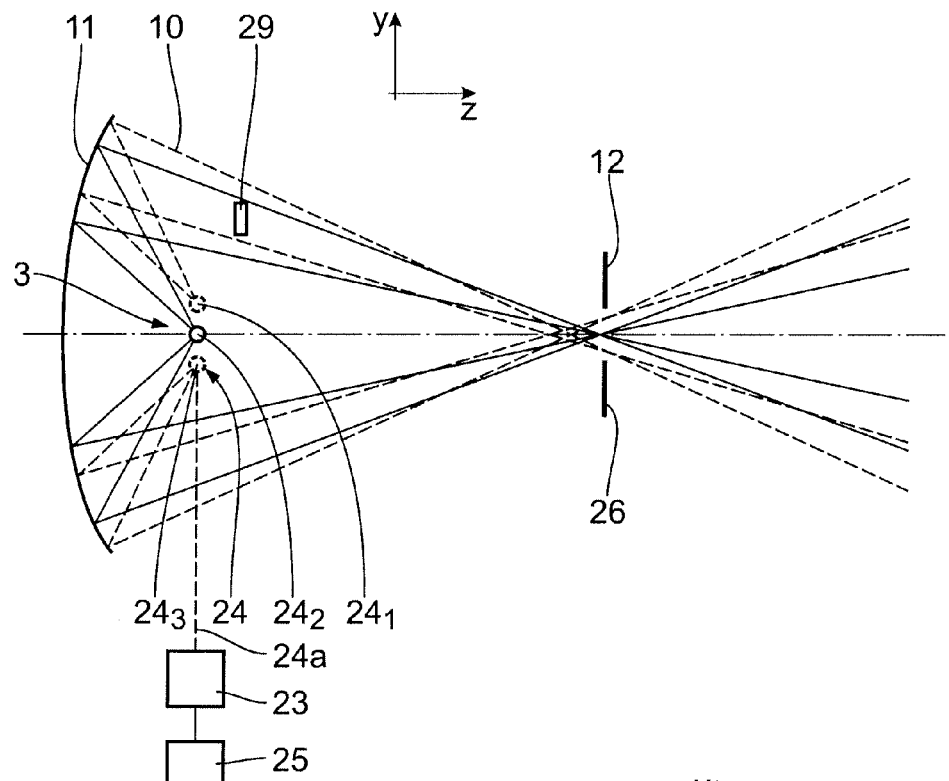
Fig. 2
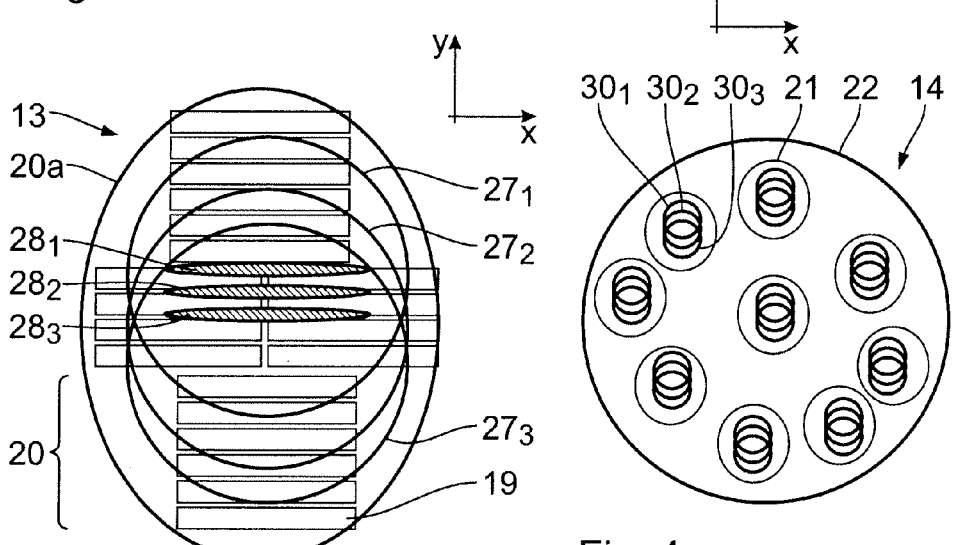
Fig. 3
Fig. 4

ILLUMINATION SYSTEM FOR EUV MICROLITHOGRAPHY

CROSS-REFERENCE TO RELATED APPLICATIONS

This application is a continuation of, and claims benefit under 35 USC 120 to, international application PCT/EP2009/004973, filed Jul. 9, 2009, which claims benefit under 35 USC 119 of German Application No. 10 2008 042 462.5, filed Sep. 30, 2008 and under 35 USC 119(e) of U.S. Ser. No. 61/101,193, filed Sep. 30, 2008. International application PCT/EP2009/004973 is hereby incorporated by reference in its entirety.

FIELD

The disclosure relates to an illumination system for EUV microlithography including an EUV light source and an illumination optics for guiding illumination light generated by the illumination optics to an object field. The disclosure further relates to a projection exposure apparatus including an illumination system of this type and a projection optics for imaging the object field into an image field, a method for the production of a microstructured or nanostructured component and a component produced according to this method.

BACKGROUND

WO 2007/128407 A1 and in EP 1 200 879 A1 disclose illumination systems for EUV microlithography including an EUV light source and an illumination optics for guiding illumination light generated by the illumination optics to an object field.

SUMMARY

The disclosure improves the homogeneity of an illumination of the object field that is achievable with the illumination system.

In some embodiments, an illumination system for EUV microlithography includes:
  a light source which is designed such that illumination light having an etendue higher than 0.01 mm$^2$ is passed into a downstream illumination optics of the illumination system,
  with the illumination optics being designed for guiding the illumination light from the light source to an object field;
  with the illumination system including at least one optical modulation component.

It has been found according to the disclosure that modulation principles which have previously been applied in synchrotron-based light sources are also applicable in other EUV light sources which have a higher etendue compared to synchrotron-based light sources. With these modulation principles that have previously been applied in synchrotron-based light sources, an illumination of the entire object field can only be achieved by modulation. This means that without the modulation, an illumination of the entire object field would be impossible. It has been found according to the disclosure that modulation principles of this type are also applicable in order to improve the homogenization of an object field illumination in EUV light sources which have an inherently higher etendue so that an illumination of the entire object field is possible even without modulation. EUV light sources of this type including light sources having an inherently higher etendue compared to synchrotron-based light sources are in particular LPP light sources where a plasma is ignited by a laser. The modulation component ensures that the illumination light passes through the illumination system along various paths, thus allowing different influences acting on the illumination light to cancel each other out along these paths. This allows a homogenization of the object field illumination to be improved without having to increase the number of optical components for transmitting the EUV illumination light through the illumination system. The modulation component may be one of the components which will be described in the following. Other modulation components which are already used in other contexts generally known from prior art are applicable as well, such as a mirror as described in EP 1 120 670 A2 where elastic vibrations of the mirror surface are the result of surface deformations. The etendue passed into the illumination optics may be higher than 0.02 mm$^2$ or even higher than 0.2 mm$^2$.

The EUV light source may generate a sequence of EUV light pulses with a pulse sequence frequency, with the optical modulation component being modulatable synchronously with the pulse sequence frequency. In an illumination system of this type, the individual light pulses are influenced in a defined manner on their way to the object field so as to homogenize the illumination thereof. In this process, all subsequent light pulses may be influenced in such a way that no two subsequent light pulses pass through the illumination optics on exactly the same path. Alternatively, the light pulses may be influenced in packages, with all light pulses of a light pulse package of this type passing through the illumination optics on exactly the same path.

The illumination optics may include at least one facet mirror including a plurality of facets for illumination of the object field via a plurality of illumination channels which are simultaneously illuminated by the light source. Compared to modulation components in the form of scanning devices known from synchrotron-based radiation sources as for instance disclosed in EP 1 200 879 A1, FIG. 2b, the advantages of the optical modulation component applied in such a channel-by-channel illumination of the object field are particularly evident. In the illumination system according to the disclosure, a plurality of the illumination channels defined by the facets can be illuminated at the same time. The modulation component can be arranged in front of the facet mirror.

The modulation component can be designed such that the illumination in an illumination channel is modulated without having to change a facet arrangement relative to the illumination channels. A modulation component of this type allows for example the position of the light source to be modulated. It is also possible to modify the way the illumination light is guided through an illumination channel. In this case, an illumination light portion remains unchanged between one illumination channel and another illumination channel. This allows one to compensate for certain effects such as shading effects or to increase the filling of an entrance pupil of a projection optics arranged downstream of the object field. An illumination system of this type may include a single facet mirror. In this case, the facet allocation in a first relative position of the facet mirror relative to one of these illuminating bundles of the EUV illumination light is determined by the portions of the bundles impinging upon respective facets of the facet mirror in this position. The facet allocation is not changed if the allocation of the respective portions of the bundle to the facets is maintained during modulation via the modulation component. The illumination system may also include two facet mirrors. In this case, the illumination channels are defined by portions of the EUV illumination light bundle which are transmitted via the facets of the first facet mirror in the beam path and then via the subsequent facet mirror in the beam path. A modulation without changing the facet allocation occurs if each illumination channel is always transmitted via the same facets of the first facet mirror on the one hand and of the second facet mirror on the other.

The modulation component may be formed by a displacement device for the light source. Such a displacement device for the light source does not require any movable downstream components in the illumination system.

The modulation component may be formed by a displacement device for a displaceable mirror between the light source and the first facet mirror. Such a displacement device for a mirror allows the illumination of the first facet mirror to be modified. The mirror may also be displaceable together with the light source.

The modulation component may be used to perform a controlled displacement of a plasma ignition point of the light source, the light source being an LPP light source. Such a displacement of the ignition point is a particularly elegant type of a displacement device for the light source.

The modulation component can be designed such that the illumination is modulated by changing the allocation of facets. Such a change of the allocation allows an illumination angle distribution and optionally also a spatial distribution of the illumination to be homogenized across the object field. This is possible in particular if an annular setting, in other words an illumination with a ring-shaped illumination angle distribution or a multipole setting, in other words an illumination with a multipole distribution of the illumination angles. is defined as illumination angle distribution. In this embodiment, portions of the illumination light alternate between various illumination channels when influenced by the modulation component.

The illumination system may include tiltable facets with a modulation component in the form of a tilt drive. Facets which are tiltable in this manner may be used to achieve modulated illuminations in an illumination channel or a modulated change of the illumination channel.

The tiltable facets may include a piezoelectric tilt drive. As far as the space and the desired tilt angles are concerned, a piezoelectric tilt drive of this type is well adapted to the desired aspects for facet tilting. A modulated voltage actuation of the piezoelectric tilt drive allows synchronization with a pulse sequence frequency of the light source as well.

The illumination system may include two facet mirrors arranged one behind the other, with first facets of the first facet mirror being allocated to second facets of the second facet mirror so as to define the illumination channels. Two facet mirrors of this type proved to be well suitable to achieve an object field illumination with a defined intensity distribution on the one hand and a defined illumination angle distribution across the object field on the other hand. The arrangement may be such that the first facet mirror is arranged in a field plane, which is conjugated with the object field plane, of a projection optics that is arrangeable downstream of the object field while the second facet mirror is arranged in a pupil plane which is allocated to a projection optics that is arrangeable downstream of the object field. Alternatively, a facet mirror arrangement in the manner of a specular reflector such as described in US 2006/0132747 A1 is conceivable as well.

The first facets and/or the second facets may be tiltable, including a modulation component in the form of a tilt drive. Facets which are tiltable in this manner allow types of homogenization to be performed whose advantages have already been described above. Tilting of the facets may be performed by a piezoelectric mechanism. Alternatively, tilting may be performed by moving the facets mechanically or electrostatically in a mechanically rotatable suspension.

The illumination optics may be designed such that the light source is imaged onto the second facets, with the second facets including a facet surface which is larger than light source images which are imaged thereon. With second facets having such a size, the light source images may be moved along the second facets in a defined manner without losing illumination light. Such a movement of the light source images on the second facets may be achieved by tilting the first facets in a corresponding manner in order to modulate the light path of the illumination light.

The advantages of a projection exposure apparatus including an illumination system according to the disclosure and a projection optics for imaging the object field into an image field, a method for the production of a microstructured or nanostructured component and a component produced according to such a method correspond to those which have already been explained above with reference to the illumination system according to the disclosure A method can include the following steps:
providing a reticle;
providing a wafer including a coating which is light-sensitive for the illumination light;
projecting at least a portion of the reticle onto the wafer with the projection exposure apparatus according to the disclosure; and
developing the coating on the wafer after exposure thereof to the illumination light.

The projection exposure apparatus may be a scanner where the reticle is continuously displaced through (scanned by the object field of the illumination system and the projection optics) on the one hand during the projection exposure, while the wafer is continuously displaced through (scanned by the image field of the projection optics) on the other hand. In this process, modulation of the optical modulation component according to the disclosure may occur on the time scale of the scanning time. The scanning time is the time during which a particular point on the reticle or the wafer, respectively, to be illuminated is exposed to the illumination light during displacement of the reticle or the wafer, respectively, through the object field or the image field, respectively. During this scanning time, the illumination-light influencing properties of the at least one optical modulation component are modified (the modulation component is, for example, displaced). The projection exposure apparatus may also be a stepper (device for step-by-step displacement) where the reticle is retained in the object field of the illumination system and the projection optics on the one hand while the wafer is retained in the image field of the projection optics on the other hand for a particular retention time. After the retention time, the reticle and the wafer are displaced by the width of the object field or the image field, respectively. When the projection exposure apparatus is designed as a stepper, the illumination-light influencing properties of the at least one optical modulation component are modified during the retention time (the modulation component is, for example, displaced).

BRIEF DESCRIPTION OF THE DRAWINGS

Embodiments of the disclosure will hereinafter be explained in more detail via the drawing in which:

FIG. 2 shows an enlarged cutout of the illumination system of the projection exposure apparatus according to FIG. 1 in the region of a light source of the illumination system;

FIG. 3 is a diagrammatic plan view of a field facet mirror of an illumination optics of the projection exposure apparatus according to FIG. 1;

FIG. 4 is a diagrammatic plan view of a pupil facet mirror of an illumination optics of the projection exposure apparatus according to FIG. 1;

DETAILED DESCRIPTION

Figure 1:
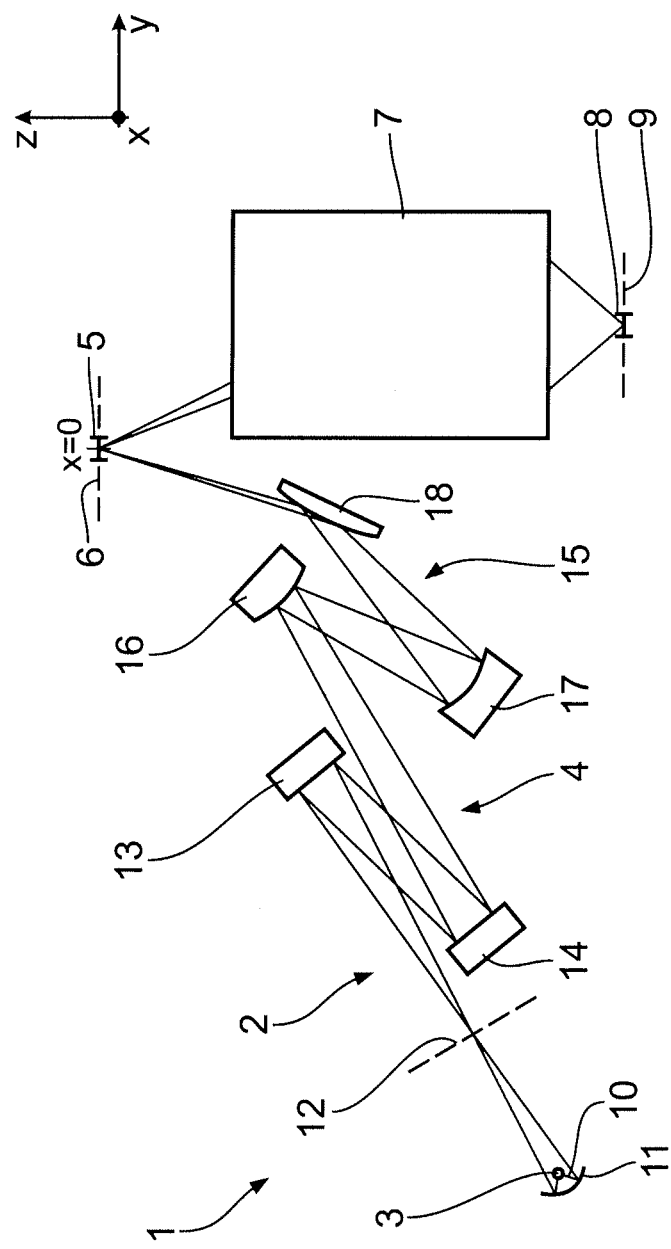
FIG. 1 shows a diagrammatic meridional section through a projection exposure apparatus for microlithography in the region of an illumination system.

FIG. 1 is a diagrammatic meridional section through a projection exposure apparatus 1 for microlithography. An illumination system 2 of the projection exposure apparatus 1 includes a radiation source 3 and an illumination optics 4 for illumination of an object field 5 in an object plane 6. A reticle is illuminated which is arranged in the object field 5 but not shown in FIG. 1, the reticle being provided with a structure to be projected using the projection exposure apparatus 1 in order to produce microstructured or nanostructured semiconductor components.

A projection optics 7 is used to image the object field 5 into an image field 8 in an image plane 9. The structure on the reticle is imaged onto a light-sensitive layer of a wafer arranged in the image plane 9 in the region of the image field 8, the wafer not being shown in the drawing.

The radiation source 3 is an EUV radiation source with an emitted useful radiation, which is also referred to as illumination light 10, in the range of 5 nm to 30 nm. The illustrated type is an LPP source (laser produced plasma). Other types of plasma sources such as a DPP source (discharge produced plasma) are applicable as well.

The radiation source 3 is imaged into the so-called intermediate focus of an intermediate focal plane 12 via a collector 11. The typical geometric etendue E at the location of the intermediate focus of an LPP source is between 0.01 mm$^2$ and 1 mm$^2$.

The geometric etendue E is defined as follows:

$$E = \int\int_{Area} dx dy \int\int_{direction\ cosine} dp_x dp_y F(x, y; p_x, p_y)$$

(see Guenther Derra and Wolfgang Singer, Proc SPIE 5037,728 (2003)).

F is the so-called aperture function. If light from the direction $p_x$, $p_y$ (with $p_x$ and $p_y$ being the respective direction cosine) impinges on the location x, y in the plane in which the etendue is calculated, then the function $F(x,y, p_x p_y)=1$, in all other cases=0. In planes where the light incidence directions consist of a circular continuous region in the angular space with a location-independent aperture $NA=\sin(\alpha)$, the geometric etendue can be calculated using the simplified formula $$E=Q_{OF}NA^2\pi.$$

In this case, $Q_{OF}$ is the illuminated surface and $NA=\sin(\alpha)$, with $\alpha$ being the half opening angle of the angle distribution in this plane.

The EUV radiation source 3 generates a sequence of EUV light pulses at a pulse sequence frequency of 50 kHz. Other pulse sequence frequencies such as between 1 kHz and 100 kHz are conceivable as well.

The EUV radiation 10 emitted by the radiation source 3 is bundled by the collector 11. The collector 11 is an ellipsoidal mirror. The radiation source 3 is disposed in a first one of the two focal points of the ellipse. Downstream of the collector 11, the EUV radiation 10 propagates through the intermediate focal plane 12 before impinging upon a field facet mirror 13. The intermediate focus in the intermediate focal plane 12 is disposed in the other focal point of the collector 11. Just like the object field 5, the field facet mirror 13 is also located in a field plane of the illumination system 2.

The EUV radiation 10 is hereinafter also referred to as illumination light or imaging light.

Downstream of the field facet mirror 13, the EUV radiation 10 is reflected by a pupil facet mirror 14. The pupil facet mirror 14 is arranged in a pupil plane of the projection optics 7. Via the pupil facet mirror 14 and an imaging optical assembly in the form of a transmission optics 15 including mirrors referred to as 16, 17 and 18 in the order defined by the beam path of the EUV radiation 10, field facets 19 (cf. FIG. 3) of the field facet mirror 13 are imaged into the object field 5 in such a way as to overlap each other. The last mirror 18 of the transmission optics 15 is a grazing incidence mirror. The transmission optics 15 and the pupil facet mirror 14 are together also referred to as subsequent optical system for transmitting the EUV radiation 10 from the field facet mirror 13 to the object field 5.

In the following, a Cartesian xyz coordinate system is used to facilitate the description of positional relationships. The x-axis of FIG. 1 extends perpendicular to the drawing plane in the direction of the viewer. The y-axis of FIG. 1 extends to the right. The z-axis of FIG. 1 extends upwards.

The reticle, which is held in place by a reticle holder (not shown), and the wafer, which is held in place by a wafer holder (not shown), are scanned synchronously in the y-direction during operation of the projection exposure apparatus 1. This will hereinafter be explained in more detail via FIG. 14 et seq.

The object field 5 may be arcuate or rectangular. The aspect ratio of the x-extension relative to the y-extension of the object field 5 corresponds to the aspect ratio of the field facets 19. In FIG. 3, a local Cartesian xy coordinate system is allocated to the field facet mirror 13, the coordinate system spanning the respective field facets 19. The x-axis, which extends to the right in FIG. 3, is parallel to the x-axis of FIG. 1. In the illustrated embodiment, the field facets 19 are rectangular. In an embodiment which is not shown, the field facets 19 can be arcuate as well, with the ratio of the extensions of such arcuate field facets in the x- and y-directions corresponding to the aspect ratio of the rectangular field facets 19 of the illustrated embodiment.

The x/y aspect ratio of the field facets 19 and the object field 5 amounts to 13/1, for example. Other aspect ratios greater than 1 are conceivable as well. Due to these aspect ratios, the x-axis is also referred to as long field axis while the y-axis is also referred to as short field axis. A particular x-coordinate in the object field 5 is also referred to as field height.

The field facets 19 of the field facet mirror 13 are combined in field facet blocks 20 each including a plurality of field facets 19. The diagrammatic illustration of the field facet mirror 13 according to FIG. 3 shows a total of four field facet blocks 20 including in each case four or six field facets 19. In practical application, there is a much higher number of such field facet blocks 20, with one of the field facet blocks 20 including a much higher number of field facets 19. The field facet mirror 13 includes several hundred field facets 19 in practice. The field facet blocks 20 are arranged on a field facet carrier which is adjustable in several degrees of freedom in practical application. Depending on the design of the field facet mirror 13, the field facet blocks 20 may be adjustable relative to the field facet carrier as well.

The pupil facet mirror 14 (compare FIG. 4) includes a plurality of round pupil facets 21 which are for instance arranged on a pupil facet carrier 22 in a hexagonal close packing FIG. 4 is a diagrammatic illustration of nine of the pupil facets 21 which are arranged at a distance from each other that is not to scale.

The field facets 19 and the pupil facets 21 may have an imaging effect and a spherically concave shape, for example.

Corresponding to the field facet carrier, the pupil facet carrier 22 may be adjustable as well. A highly reflective coating on the facets 19, 21 is formed by a multilayer coating in practical application, the multilayer coating including alternating layers of molybdenum and silicon. The facets 19, 21 are mirror facets for the EUV radiation 10.

The field facets 19 are in each case individually allocated to the pupil facets 21 so that portions of the illumination light bundle of the EUV radiation 10 impinging upon in each case one of the field facets 19 are transmitted to the object field 5 via the associated pupil facet 21. The two facet mirrors 13, 14 therefore define a plurality of illumination channels each of which transmits in each case a portion of the EUV radiation 10 to the object field. The radiation source 3 is imaged on the pupil facets 21 via each of the illumination channels.

The projection optics 7 has a numerical aperture NA of 0.0625 on its inlet side and images the object field 5 onto the image field 8 with an extension of 100 mm in the x-direction and 8 mm in the y-direction.

The EUV radiation source 3 serves to illuminate a plurality of the illumination channels of the illumination optics 4 at the same time using a single light pulse of the pulse sequence.

The projection exposure apparatus 1 includes an optical modulation component which is modulatable synchronously with the pulse sequence frequency of the radiation source 3. The radiation source 3 includes a media source 23 which provides a sequence of tin droplets 24 on the one hand and an ignition laser beam 24a on the other. The modulation component 25, which is signally connected with the media source 23, is synchronized with the pulse sequence of the radiation source 3 in such a way that the tin droplets 24 are ignited at different points during subsequent pulses or during subsequent pulse packages so as to form a plasma that generates the illumination light 10. Depending on the ignition point $24_1$ to $24_3$ to be defined, the modulation component 25 ensures that the tin droplet 24 overlaps in space and time with the ignition laser beam 24a at this particular point. It is diagrammatically outlined in FIG. 2 that the ignition laser beam 24a comes from the direction of the media source 23. This is not the case in practical application. More realistic examples of the conditions in an LPP light source can be found in WO 2004/092693 A2. Illustrated in FIG. 2 are three such different points which are numbered $24_1$, $24_2$, and $24_3$ from top to bottom. FIG. 2 shows the various edge beam paths of the illumination light 10 which start at the tin droplet points $24_1$ to $24_3$ and extend to just behind the intermediate focal plane 12. At the location of the intermediate focal plane 12 is arranged an intermediate focal diaphragm 26 which allows illumination light 10 to pass through irrespective of the ignition point $24_1$ to $24_3$.

FIG. 3 shows a far field light distribution $27_1$, $27_2$, $27_3$ of the illumination light 10, which distribution $27_1$, $27_2$, $27_3$ is displaced on the field facet mirror 13 depending on the ignition point $24_1$ to $24_3$. Taken together, the three far field light distributions $27_1$ to $27_3$ illuminate all field facets 19 of the field facet mirror 13. Each of the far field light distributions $27_1$ to $27_3$ illuminates a plurality of the field facets 19. Approximately half of all field facets 19 of the field facet mirror 13 are illuminated by all three far field light distributions $27_1$ to $27_3$, i.e. irrespective of the ignition point $24_1$ to $24_3$. A far field shading 28 of a retaining structure 29, which is diagrammatically outlined in FIG. 2 in the beam path of the illumination light 10 between the collector 11 and the intermediate focal plane 12, moves in accordance with the displacement of the ignition point $24_1$ to $24_3$, as indicated in FIG. 3 by the corresponding sequence of field facet shadings $28_1$ to $28_3$. The field facets 19 seeing the far field shading $28_1$ are for instance illuminated without shadings by the far field light distribution $27_3$ as the far field shading $28_3$ has then moved towards other field facets 19. Therefore, each of the field facets 19 makes at least one completely unshaded contribution to the illumination of the object field 5 during one ignition point sequence $24_1$ to $24_3$.

Alternatively, the far field light distribution may also be varied to a much smaller extent, with the result that all field facets are completely illuminated at any time but are exposed to an intensity distribution which varies over time due to the far field displacement. The variation of the intensity distribution across the field facets results in a temporal homogenization of the reticle illumination as well.

The ignition points may be modified at the pulse sequence frequency of the light source. Alternatively, the ignition points may be modified at a lower frequency. For example, a sequence of ten EUV light pulses may be ignited at the ignition point $24_1$ before another sequence of ten light pulses is ignited at the ignition point $24_2$ and finally another sequence of ten light pulses is ignited at the ignition point $24_3$. The modulation component 25 is then operated at a frequency which is reduced by a factor of 10 compared to the pulse sequence frequency of the EUV light source 3.

FIG. 4 illustrates the effects on the imaging of the light source 3 on the pupil facet mirrors 21 when the ignition points $24_1$ to $24_3$ are modified. Depending on the ignition point $24_1$ to $24_3$, light source images $30_1$, $30_2$, $30_3$ are obtained on the individual pupil facets 21 which light source images $30_1$, $30_2$, $30_3$ are displaced relative to each other on the pupil facets 21. The pupil facets 21 have such a size that the light source images $30_1$ to $30_3$ are completely disposed on the pupil facets 21 irrespective of the position of the light source images $30_1$ to $30_3$ so that the illumination light 10 is completely reflected by the pupil facets 21 irrespective of the ignition point $24_1$ to $24_3$, with the result that the light source images $30_1$ to $30_3$ are not cut off at the edges of the pupil facets 21.

When the illumination system 2 is equipped with the modulation component 25, the illumination in an illumination channel is modulated without having to change the allocation of the facets 19, 21 relative to the illumination channels.

The modulation component 25 leads to a displacement of the ignition point which then results in a displacement of the light source 3. The modulation component 25 is therefore a displacement device for the light source 3.

Other modulation components in the form of tiltable facets 19, 21 may be provided alternatively or in addition to the modulation component 25. A tiltable facet of this type is diagrammatically shown in FIG. 5 by the example of one of the field facets 19. A field facet carrier body 31 of the field facet 19 is at least partially formed of a piezoelectric crystal 32. The crystal 32 is electrically connected with an alternating voltage source 35 via lines 33, 34. This alternating voltage results in a displacement of a reflective surface (a facet surface 36), of the field facet 19 from a zero-potential position shown by a continuous line in FIG. 5 to a tilted displacement position which is displaced by a value ΔL as shown by a dashed line in FIG. 5. A ratio of the displacement ΔL relative to a total height L of the piezoelectric crystal 32 is in the range of 1/1000.

The alternating voltage source 35 is another example of a modulation component. The alternating voltage source 35 is again synchronized with the pulse sequence frequency of the light source 3.

The following is a description of applications of piezoelectrically tiltable facets via FIGS. 6 to 9. In contrast to the embodiment according to FIGS. 1 to 5, the light source 3 is stationary in these embodiments.

Figure 6:
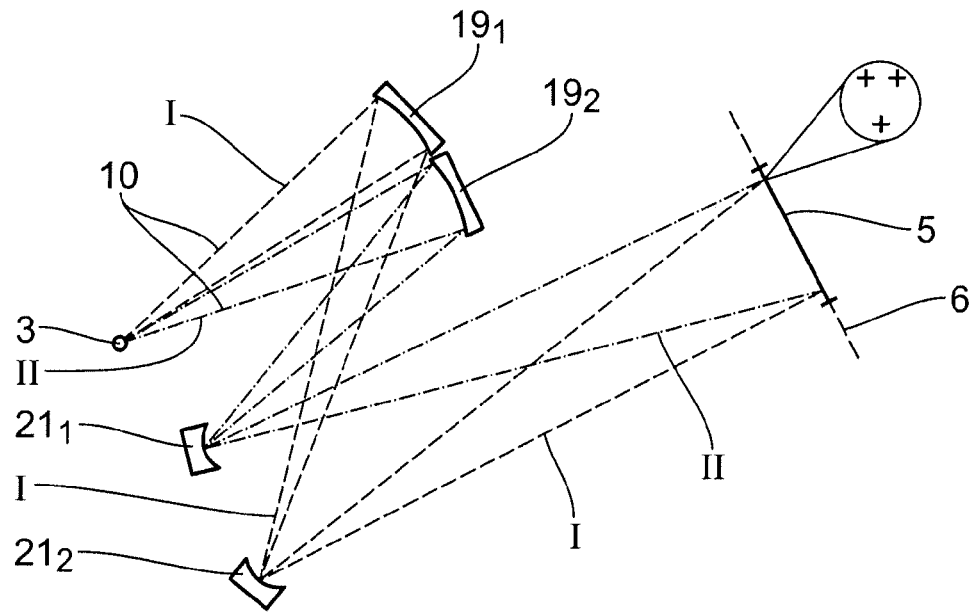
FIG. 6 is a diagrammatic view of two illumination channels of the illumination optics of the projection exposure apparatus according to FIG. 1, with two field facets and two pupil facets being in a first current position.

FIG. 6 is a diagrammatic illustration of two illumination channels I, II for illumination of the object field 5 in the object plane 6. The Figure shows two field facets $19_1$, $19_2$ which are allocated to these two illumination channels I, II, and two pupil facets $21_1$, $21_2$ which are allocated to these illumination channels. A first illumination channel I is defined by a portion of the illumination light 10; starting from the light source 3, the first illumination channel I is at first reflected by the field facet $19_1$ and then by the pupil facet $21_2$ before impinging upon the object field 5. The second illumination channel II is defined by another portion of the illumination light 10; starting from the light source 3, the second illumination channel II is at first reflected by the field facet $19_2$ and then by the pupil facet $21_1$ before impinging upon the object field 5.

If there is a shading in the illumination channel II for example, more illumination 10 is transported through the illumination channel I than through the illumination channel II. FIG. 6 is a diagrammatic illustration of an angular distribution of a field point illumination at the edge of the object field 5 in the beam path behind the object plane 6. As the illumination channel I transports more illumination light 10 than the illumination channel II, this object field point sees a higher illumination intensity ++ from the direction of the illumination channel I and a lower illumination intensity + from the direction of the illumination channel II.

Figure 7:
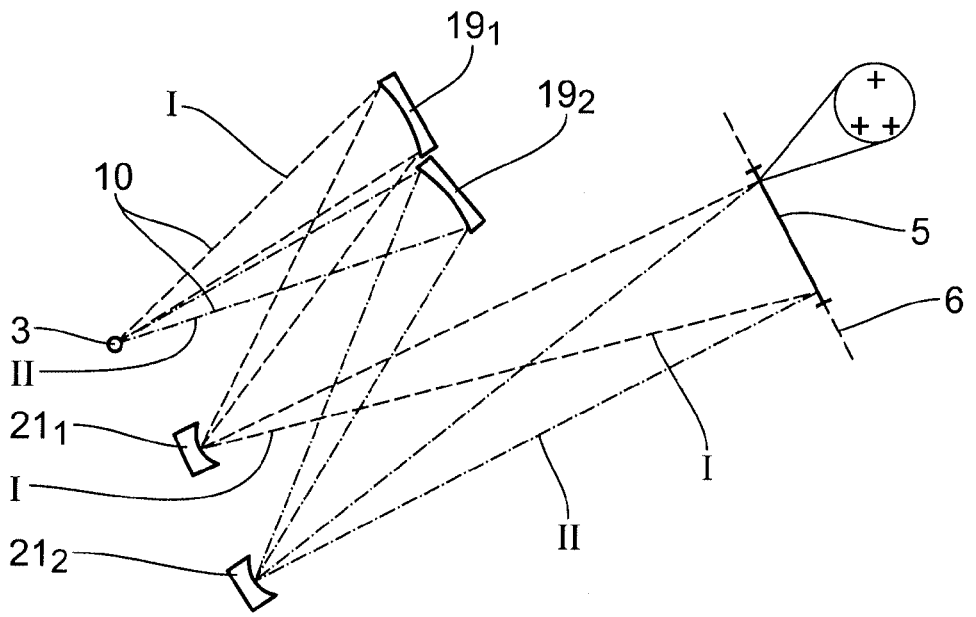
FIG. 7 is a diagrammatic view of two illumination channels of the illumination optics of the projection exposure apparatus according to FIG. 1, with the two field facets and the two pupil facets according to FIG. 6 being in another current position.

FIG. 7 shows the situation where an alternating voltage source 35 (not shown in FIGS. 6 and 7) allocated to the field facets $19_1$, $19_2$ on the one hand and to the pupil facets $21_1$, $21_2$ on the other is used to perform a piezoelectric tilting of these four facets shown in FIG. 7. When the two field facets $19_1$, $19_2$ are tilted, the illumination channel I is modified such that the pupil facet $19_1$ is now allocated to the downstream pupil facet $21_1$. The illumination channel II is modified such that the field facet $19_2$ is now allocated to the down-stream pupil facet $21_2$. When the two pupil facets $21_1$, $21_2$ are tilted, both illumination channels I, II overlap again in the object field 5. As the illumination channel I transports more illumination light 10 than the illumination channel II, the illumination angle distribution is now exactly reversed, as shown in FIG. 7 behind the object plane 6.

A comparison of the illumination situations according to FIGS. 6 and 7 shows that on average, the object field 5 sees the same illumination intensity, namely in each case the sum of the illumination intensities + and ++, from the two illumination directions defined by the position of the pupil facets $21_1$ and $21_2$.

As an alternative to a piezoelectric tilting of the facets, for instance the pupil facets 21 in the arrangement according to FIG. 7, the field facets 19 or the pupil facets 21 may also be moved mechanically or electrostatically in a mechanically rotatable suspension.

Figure 8:
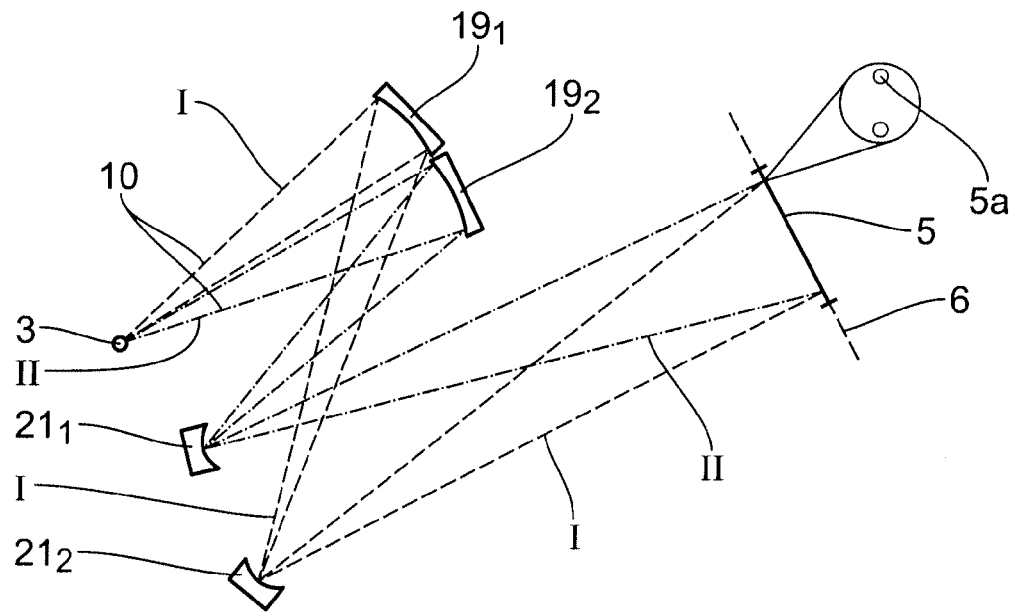
FIG. 8 is an illustration similar to FIG. 6 of two illumination channels of another embodiment of the illumination optics, with two field facets being in a first current position.
Figure 9:
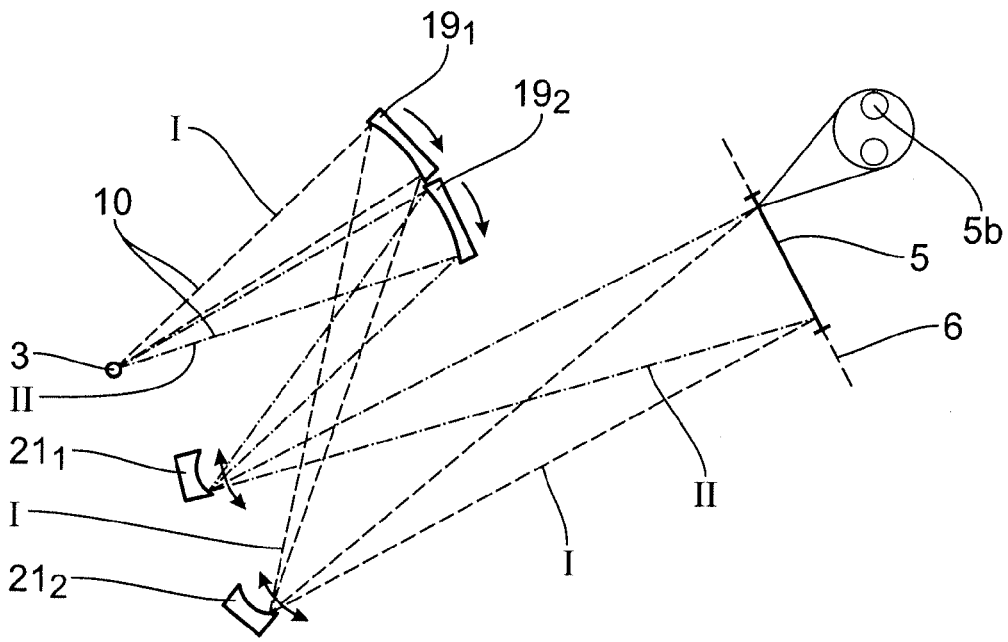
FIG. 9 is an illustration similar to FIG. 6 of the two illumination channels of the illumination optics according to FIG. 8, with the two field facets being in further current positions.

The following is a description, via FIGS. 8 and 9, of the application of tiltable facets in order to adjust the etendue of the light source 3 to the higher etendue of the projection optics 7 imaging the object field 5.

Figure 5:
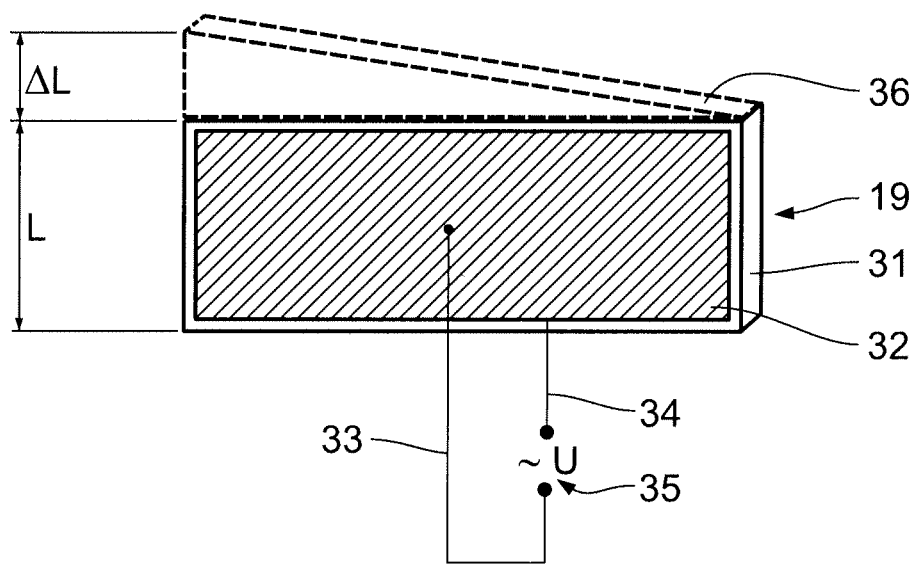
FIG. 5 is a diagrammatic and greatly enlarged perspective view of an individual field facet of the field facet mirror according to FIG. 3.

In the embodiment according to FIGS. 8 and 9, the field facets $19_1$, $19_2$ are piezoelectrically tiltable in the manner illustrated in FIG. 5. Compared to the tilt angle in the embodiment according to FIGS. 6 and 7, the tilt angle of the field facets $19_1$, $19_2$ is so small that even if the field facets $19_1$, $19_2$ have been tilted by a voltage applied to the piezoelectric crystal 32, it is still the same pupil facet 21 that is illuminated with the illumination light 10 by the tilted field facet 19.

FIG. 8 shows the situation where the two field facets $19_1$, $19_2$ illuminate in each case the center of the pupil facets $21_1$, $21_2$.

FIG. 9 shows the situation where the field facets $19_1$, $19_2$ illuminate the lower edge—according to FIGS. 8 and 9—of the associated pupil facets $21_1$, $21_2$ by applying the voltage to the piezoelectric crystals 32 of the field facets $19_1$, $19_2$. In a position (not shown) of the field facets $19_1$, $19_2$ which is similar to FIG. 9, with the field facets $19_1$, $19_2$ however being tilted exactly in the opposite direction compared to the situation according to FIG. 8, the field facets $19_1$, $19_2$ illuminate the upper edge of the pupil facets $21_1$, $21_2$ in FIGS. 8 and 9. When the field facets $19_1$, $19_2$ are tilted, thus causing the light source images 30 to move along the pupil facets $21_1$, $21_2$, this results in an illumination of the object field 5 with a greater angular bandwidth compared to the stationary situation according to FIG. 8. This leads to a fuller use of the illuminatable entrance pupil of the projection optics 7 downstream of the object field 5. This becomes evident when comparing the angular distributions of an object field point illumination from the direction of the two pupil facets $21_1$, $21_2$, the angular distributions being in each case outlined in FIGS. 8 and 9 in the beam path downstream of the object plane 6.

Figure 10:
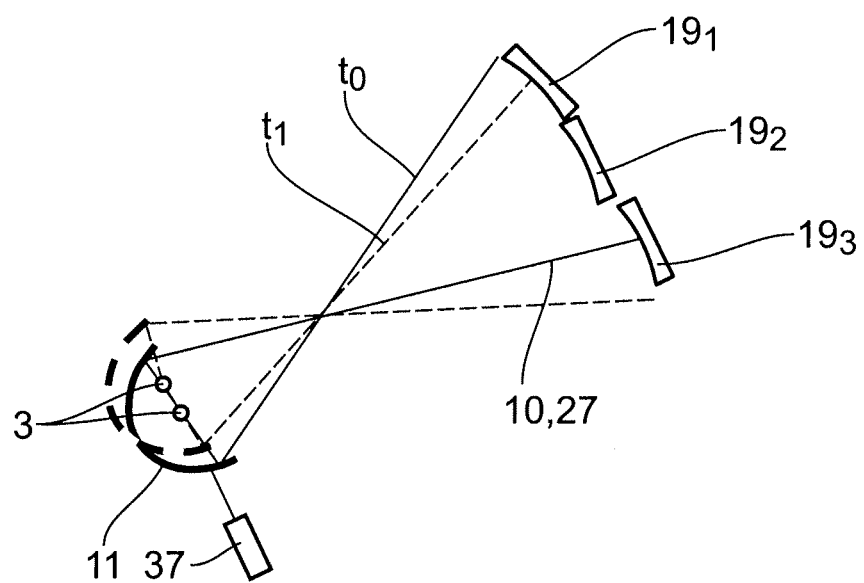
FIG. 10 is an illustration similar to FIG. 2 of a cutout of the illumination system, with a collector mirror that is displaceable together with the light source being shown in two different current positions.

FIG. 10 shows an embodiment of the illumination system 2 where the modulation component is a displacement device 37 for the collector 11. The displacement device 37 is mechanically coupled to the collector 11. The displacement device 37 is modulatable synchronously with the pulse sequence frequency of the light source 3. The light source 3 is displaced together with the collector 11.

A first current position of the collector 11 is shown by a continuous line in FIG. 10. Another current position of the displaced collector 11 and light source 3 as well as the resulting modified illumination of three field facets $19_1$, $19_2$, $19_3$ are shown by dashed lines in FIG. 10. The displacement of the collector 11 causes the far field light distribution 27 to overlap correspondingly on the field facets $19_1$ to $19_3$.

Figure 11:
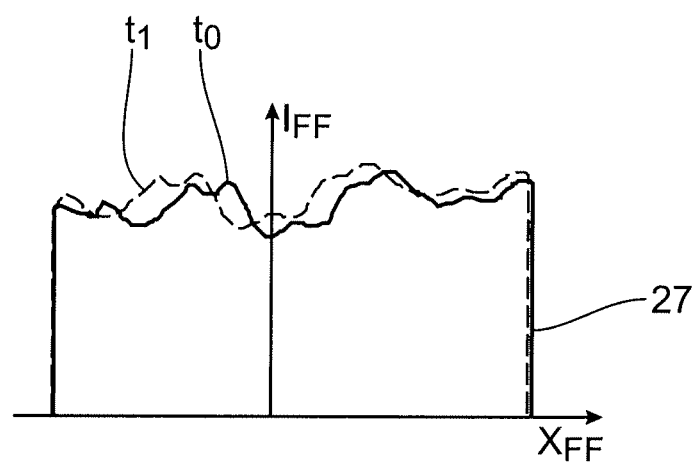
FIG. 11 shows the intensity distributions of an illumination of an object field of the projection exposure apparatus in a direction perpendicular to an object displacement direction, the intensity distributions being allocated to the current positions according to FIG. 10.

FIG. 11 shows the effects of an intensity distribution of the illumination of the object field 5 with the illumination light 10 in a direction perpendicular to the displacement direction y of the reticle (in the x-direction) when the far field light distribution 27 is displaced. The displacement of the far field distribution 27 causes maxima and minima of the illumination light distribution to overlap correspondingly in the x-direction. The displacement therefore results in a temporal homogenization of the object field illumination in the x-direction.

Figure 12:
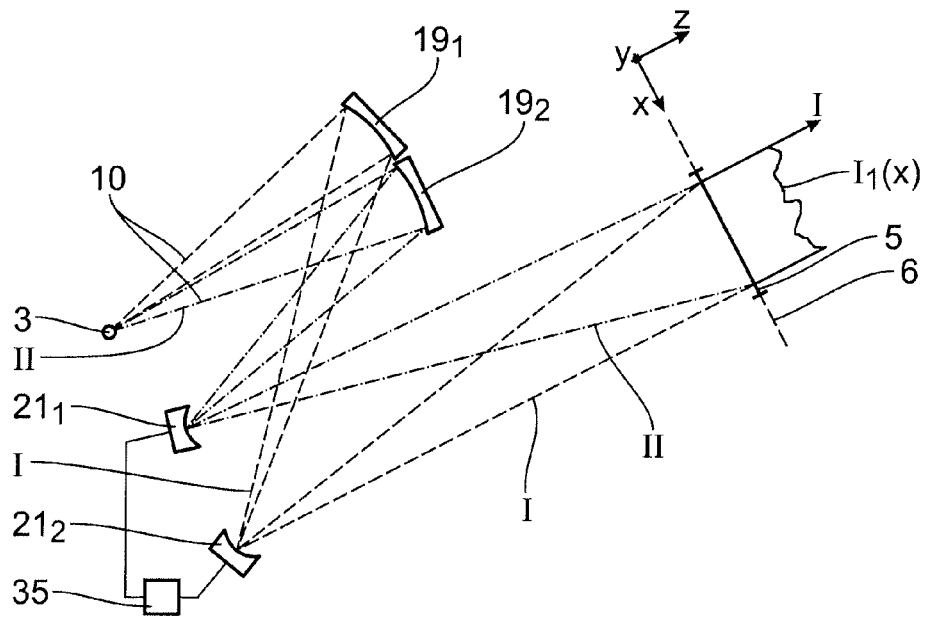
FIG. 12 shows an illustration similar to FIG. 6 of two illumination channels of another embodiment of the illumination optics, with two pupil facet mirrors being in a first current position.
Figure 13:
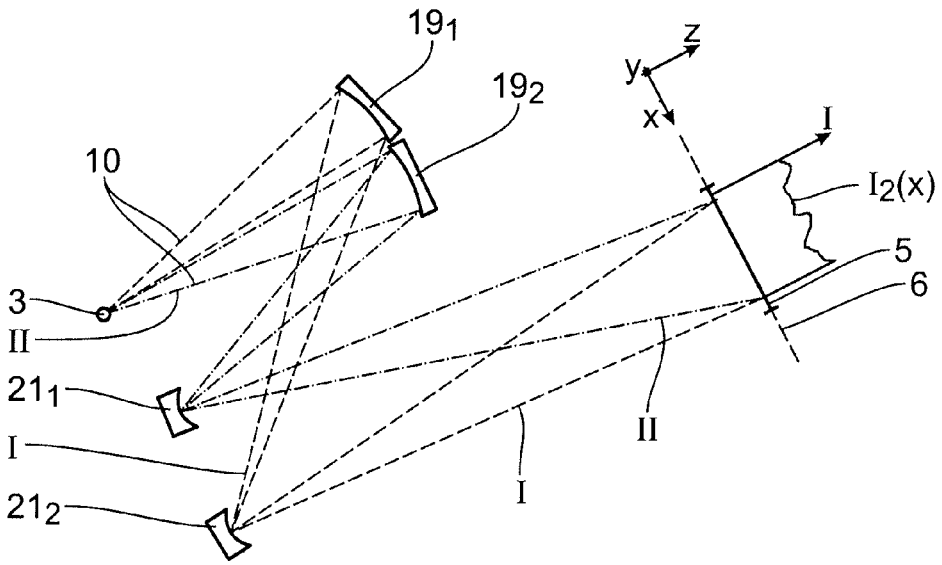
FIG. 13 shows an illustration similar to FIG. 6 of the two illumination channels according to FIG. 12, with the two pupil facet mirrors being in another current position.

The following is a description, via FIGS. 12 and 13, of another application of facets 19, 21 which are tiltable according to FIG. 5 for homogenizing the illumination of the object field.

In the embodiment according to FIGS. 12 and 13, only the pupil facets 21, i.e. the pupil facets $21_1$, $21_2$ in the illustration according to FIGS. 12 and 13, are tiltable in the xz-plane. The field facets 19 are not tiltable in the embodiment according to FIGS. 12 and 13.

FIG. 12 shows a current position of the pupil facets $21_1$, $21_2$ where the two illumination channels I, II overlap approximately in the center of the object field 5 to be illuminated when seen in the x-direction. FIG. 13 shows the situation where the two facet mirrors $21_1$, $21_2$ are in a position that is tilted by way of a corresponding voltage actuation performed by the alternating voltage source 35 in such a way that the two illumination channels I, II overlap in the object field 5 at a position that is displaced in the positive x-direction. This results in a homogenization of an intensity distribution I(x) perpendicular to the reticle displacement direction y, the homogenization being the temporal average of the intensity distributions $I_1(x)$, $I_2(x)$ at the various current positions shown in FIGS. 12 and 13. In order to produce a microstructured component, in particular a semiconductor component such as a microchip, the reticle and the wafer are provided in a first step. The wafer is provided with a coating that is light-sensitive for the illumination light 10. Subsequently, at least a portion of the reticle is projected onto the wafer via the projection exposure apparatus 1. At least one of the above-described optical modulation components 25, 35, 37 is used in this process. The light-sensitive layer on the wafer exposed to the illumination light 10 is then developed so as to obtain the desired structure. During projection exposure, the reticle is displaced in an object displacement direction, namely in the y-direction in FIG. 1.

The displacement process (the scanning process of the reticle and the wafer) is illustrated in FIGS. 14 to 17.

Figure 14:
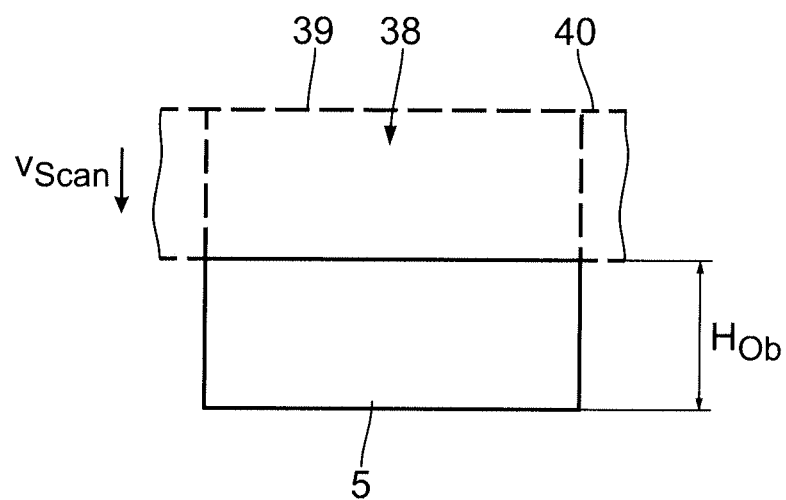
FIG. 14 is a diagrammatic plan view of an object field of the projection exposure apparatuses and a reticle when used in one of the projection exposure apparatuses at the beginning of a projection exposure scan.

FIG. 14 is a diagrammatic plan view of the object field 5 together with the reticle which is denoted by the reference numeral 38 in the following description. A surface 39 to be illuminated is shown dashed in FIG. 14. The reticle 38 is held in place by a partially shown reticle holder 40. The reticle 38 may be a reticle that is reflective or transmissive of the illumination light. If a reflective reticle 38 is used, the entire rear side thereof can be supported by the reticle holder 40.

FIG. 14 shows the reticle 38 in a position relative to the object field 5 at the beginning of a projection exposure scan. In this position, a longitudinal side, disposed at the bottom of FIG. 14, of the reticle surface 39 to be illuminated coincides with a longitudinal side, disposed at the top of FIG. 14, of the object field 5.

During projection exposure, the reticle 38 is scanned in the y-direction at a speed $v_{Scan, Ob}$.

Figure 15:
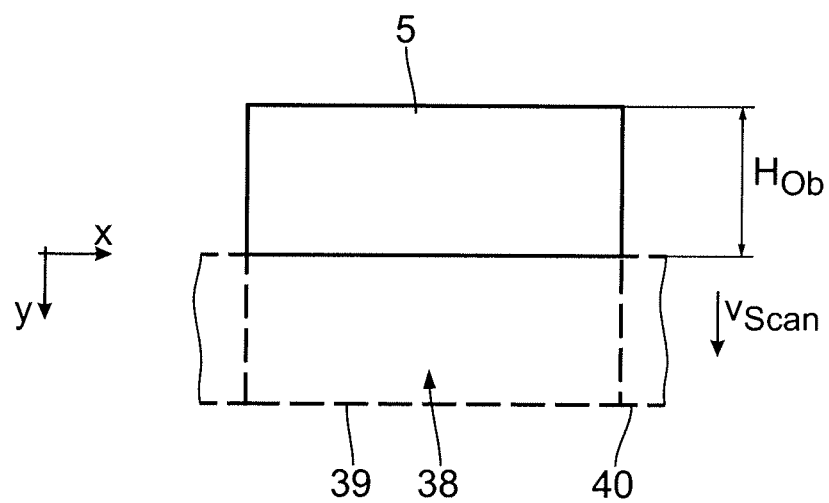
FIG. 15 shows the object field and the reticle according to FIG. 14 at the end of the projection exposure scan.

FIG. 15 shows the relative position of the reticle 38 relative to the object field 5 at the end of the projection exposure scan. Compared to the position according to FIG. 14, the reticle 38 is displaced in the y-direction by twice the height $H_{Ob}$ of the object field 5. A longitudinal side, shown at the top of FIG. 15, of the reticle surface 39 to be illuminated coincides with a longitudinal side, disposed at the bottom of FIG. 15, of the object field.

When the reticle 38 is displaced between the two relative positions according to FIGS. 14 and 15, each point on the reticle 38 is exposed to the illumination light during displacement by once the height $H_{Ob}$ of the object field 5 in the y-direction.

A scanning time $t_{Scan}$ of the projection exposure scan (the time during which an object field point is exposed to the illumination light during displacement of the reticle 38) amounts to $$t_{Scan} = H_{Ob}/v_{Scan, Ob}$$

$t_{Scan}$ is usually in the range smaller than 100 ms and in particular in the range between 1 ms and 20 ms.

Figure 16:
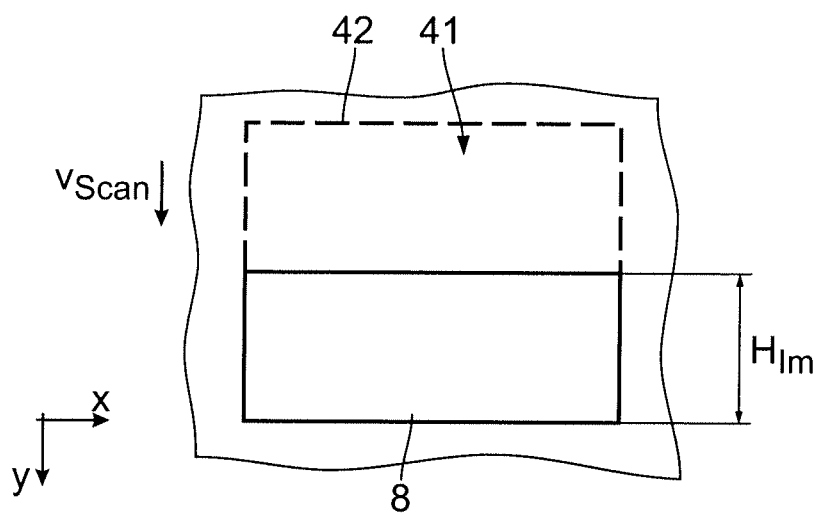
FIG. 16 is a diagrammatic plan view of an image field and a cutout of a wafer when used in one of the projection exposure apparatuses at the beginning of the projection exposure scan (at a time corresponding to the arrangement according to FIG. 14)
Figure 17:
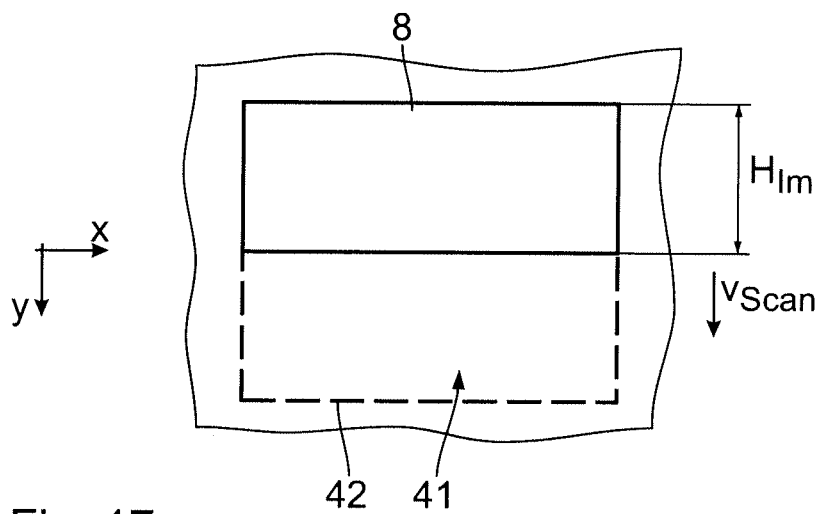
FIG. 17 shows the image field and the wafer cutout at the end of the projection exposure scan (at a time corresponding to the arrangement according to FIG. 15).

The wafer is moved through the image field 8 synchronously with the reticle 38. This is illustrated in FIGS. 16 and 17 where a portion of the wafer is shown that is denoted by the reference numeral 41. The wafer is held in place by a wafer holder or wafer table, respectively, not shown in more detail.

FIG. 16 shows the relative position of a surface 42 of the wafer 41 to be illuminated during an individual projection exposure scan, the relative position thus being synchronized with the relative position according to FIG. 14. In other words, FIG. 16 shows the situation in the vicinity of the wafer at the beginning of the projection exposure scan. In the position according to FIG. 16, a longitudinal side, shown at the bottom of FIG. 16, of the wafer surface 42 to be illuminated coincides with the longitudinal side, shown at the top of FIG. 16, of the image field 8.

During the projection exposure scan, the wafer 41 is displaced in the y-direction at a speed $v_{Scan, Im}$ by the wafer holder.

FIG. 17 shows the relative position of the wafer surface 42 to be illuminated relative to the image field 8 at the end of the individual projection exposure scan, the relative position being synchronized with the relative position according to FIG. 15. In this relative position according to FIG. 17, a longitudinal side, shown at the top of FIG. 17, of the wafer surface 42 to be illuminated coincides with a longitudinal side, shown at the bottom of FIG. 17, of the image field 8. When the reticle 38 is displaced between the two relative positions according to FIGS. 14 and 15, each point on the wafer is exposed to the illumination light during displacement by once the height $H_{Im}$ of the image field 8 in the y-direction. The scanning time $t_{Scan}$ of the projection exposure scan (the time during which an image field point is exposed to the illumination light during displacement of the reticle 38) is alternatively obtained as follows:

$$t_{Scan} = H_{Im}/v_{Scan,Im}$$

with $H_{Im}$ being the image field height in the y-direction.

The above-described modulation components 25, 35 and 37 are configured such that a modulation of these components 25, 35, 37 occurs on the time scale of the scanning time $t_{Scan}$, thus allowing the modulation component to be modified during an individual projection exposure scan.

What is claimed is:

1. An illumination system, comprising:
a light source configured to generate illumination light;
an illumination optics comprising an optical modulation component,
wherein:
the modulation component comprises a displacement device configured to displace the light source;
the light source is configured to pass illumination light having an etendue higher than 0.01 mm² into the illumination optics;
the illumination optics is configured to guide the illumination light from the light source to an object field during a scanning time having a time scale;
the illumination system is configured so that modulation of the optical modulation component occurs on the time scale of the scanning time;
the illumination optics comprises a first facet mirror comprising a plurality of facets configured to illuminate the object field via a plurality of illumination channels which are configured to be simultaneously illuminated by the light source; and
the illumination system is configured to be used in EUV microlithography.

2. The illumination system of claim 1, wherein the EUV light source is configured to generate a sequence of EUV light pulses at a pulse sequence frequency, and the optical modulation component is modulatable synchronously with the pulse sequence frequency.

3. The illumination system of claim 1, wherein the modulation component is configured so that, during use of the illumination system, the illumination within one illumination channel is modulated without changing a facet allocation relative to the illumination channels.

4. The illumination system of claim 1 wherein the illumination optics comprises a displaceable mirror between the light source and the first facet minor, and the modulation component comprises a displacement device configured to displace the displaceable mirror.

5. The illumination system of claim 1, wherein the light source comprises an LPP light source, and the modulation component is configured to cause a controlled displacement of a plasma ignition point.

6. The illumination system of claim 1, wherein the modulation component is configured so that illumination of the object field is modulated by changing the allocation of facets of the first facet mirror.

7. The illumination system of claim 6, wherein the modulation component comprises a tilt drive configured to tilt the facets.

8. The illumination system of claim 7, wherein the tilt drive comprises a piezoelectric tilt drive.

9. The illumination system of claim 1, further comprising a second facet mirror comprising a plurality of facets, wherein the first and second facet mirrors are arranged one behind the other, and the facets of the first facet mirror are allocated to facets of the second facet mirror to define the illumination channels.

10. The illumination system of claim 9, comprising a first tilt drive configured to tilt the facets of the first facet mirror.

11. The illumination system of claim 10, comprising a second tilt drive configured to tilt the facets of the second facet mirror.

12. The illumination system of claim 9, comprising a tilt drive configured to tilt the facets of the second facet mirror.

13. The illumination system of claim 9, wherein the illumination optics is designed so that the light source is imaged onto the facets of the second facet mirror, and the facets of the second facet mirror comprise a facet surface which is larger than a surface that the light source images on the facets of the second facet mirror.

14. An apparatus, comprising:
an illumination system of claim 1; and
a projection optics configured to image the object field into an image field,
wherein the apparatus is a projection exposure apparatus.

15. The apparatus of claim 14, wherein the apparatus is a scanning projection exposure apparatus, and the optical modulation component is configured so that the illumination light is modulated during the scanning time of a projection exposure scan.

16. The apparatus of claim 14, wherein the scanning time is less than 100 milliseconds.

17. The apparatus of claim 14, wherein the scanning time is between one millisecond and 20 milliseconds.

18. A method, comprising:
a) using a projection exposure apparatus to project a portion of a reticle onto a light-sensitive coating of a wafer; and
b) after a), developing the light-sensitive layer of the wafer to provide a microstructured or nanostructured component,
wherein the projection exposure apparatus comprises:
an illumination system according to claim 1; and
a projection optics configured to image the object field into an image field.

19. The method of claim 18, wherein the projection exposure apparatus is a scanning projection exposure apparatus, and the method comprises modulating the illumination light during the scanning time of a projection exposure scan.

20. The method of claim 19, wherein modulation of the illumination light is on a time scale of the scanning time, and the scanning time is less than 100 milliseconds.

21. The method of claim 18, wherein the scanning time is less than 100 milliseconds.

22. The method of claim 18, wherein the scanning time is between one millisecond and 20 milliseconds.

23. The illumination system of claim 1, wherein the scanning time is less than 100 milliseconds.

24. The illumination system of claim 1, wherein the scanning time is between one millisecond and 20 milliseconds.

25. The illumination system of claim 1, wherein the illumination system has no moveable components downstream of the lights source.

26. The illumination system of claim 1, wherein:
the first facet mirror is a field facet mirror; and the facets of the field facet mirror are configured so that, during use of the illumination system, each field facet makes at least one completely unshaded contribution to the illumination of the object field during a sequence of spaced apart ignition points.

27. The illumination system of claim 1, wherein:
the first facet mirror is a field facet mirror; and
the field facet mirror is configured so that, during use of the illumination system, each field facet is:
completely illuminated at any time; and
exposed to an intensity distribution which varies over time due to a far field displacement due to displacement of the light source.

28. The illumination system of claim 1, wherein the illumination system is configured so that during use of the illumination system:
the modulation component causes a controlled displacement of plasma ignition points; and
the ignition points are modified at a pulse sequence frequency of the light source.

29. The illumination system of claim 1, wherein the illumination system is configured so that during use of the illumination system:
the modulation component causes a controlled displacement of plasma ignition points; and
the ignition points are modified at a frequency that is less than a pulse sequence frequency of the light source.

30. The illumination system of claim 1, wherein:
the illumination optics further comprise a pupil facet mirror comprising pupil facets;
the pupil facets are sized so that, during use of the illumination system, light source images are completely disposed on the pupil facets irrespective of a position of the light source images.

31. The illumination system of claim 1, wherein the modulation component is configured so that, during use of the illumination system, illumination of the object field is modulated without changing an allocation of facets of the first facet mirror.

32. The illumination system of claim 1, wherein:
the illumination system further comprises a collector configured to bundle radiation emitted by the light source; and
the illumination system is configured so that, during use of the illumination system, the light source is displaced together with the collector.

33. An illumination system, comprising:
a light source configured to generate illumination light; and
an illumination optics comprising an optical modulation component;
a first facet mirror comprising a plurality of facets configured to illuminate an object field via a plurality of illumination channels which are configured to be simultaneously illuminated by the light source;
a second facet mirror comprising a plurality of facets, the first and second facet mirrors being arranged one behind the other, and the facets of the first facet mirror being allocated to facets of the second facet mirror to define the illumination channels; and
a tilt drive configured to tilt the facets of the second facet mirror,
wherein:
the illumination system is an EUV microlithography illumination system;
the modulation component comprises a displacement device configured to displace the light source;
the light source is configured to pass illumination light having an etendue higher than 0.01 mm$^2$ into the illumination optics;
the illumination optics is configured to guide the illumination light from the light source to a reticle in the object field during a scanning time having a time scale;
the reticle is displaceable in a displacement direction;
the illumination system is configured so that modulation of the optical modulation component occurs on the time scale of the scanning time;
in a first tilt position of the facets of the second facet mirror, the illumination channels overlap in the object field along a coordinate perpendicular to the displacement direction in a first position; and
in a second tilt position of the facets of the second facet mirror, the illumination channels overlap in the object field along the coordinate perpendicular to the displacement direction in a second position that is displaced relative to the first position.

34. The illumination system of claim 33, wherein the facets of the second facet mirror are configured to homogenize an intensity distribution perpendicular to the displacement direction of the reticle.

* * * * *

UNITED STATES PATENT AND TRADEMARK OFFICE
CERTIFICATE OF CORRECTION

PATENT NO. : 9,304,400 B2
APPLICATION NO. : 13/038453
DATED : April 5, 2016
INVENTOR(S) : Michael Layh et al.

Page 1 of 1

It is certified that error appears in the above-identified patent and that said Letters Patent is hereby corrected as shown below:

In the specification,

Col. 4, line 21, after "disclosure", insert -- . --.

In the claims,

Col. 13, line 54, Claim 4, delete "minor," and insert -- mirror, --.

Signed and Sealed this
Fifth Day of July, 2016

Michelle K. Lee
*Director of the United States Patent and Trademark Office*